United States Patent
Nagasaka et al.

(10) Patent No.: US 10,262,616 B2
(45) Date of Patent: Apr. 16, 2019

(54) DISPLAY DEVICE AND DRIVE METHOD THEREFOR

(71) Applicant: Sharp Kabushiki Kaisha, Sakai, Osaka (JP)

(72) Inventors: Kohji Nagasaka, Sakai (JP); Takashi Sasaki, Sakai (JP); Kazumasa Hata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/571,316

(22) PCT Filed: Jul. 15, 2016

(86) PCT No.: PCT/JP2016/070937
§ 371 (c)(1),
(2) Date: Nov. 2, 2017

(87) PCT Pub. No.: WO2017/018241
PCT Pub. Date: Feb. 2, 2017

(65) Prior Publication Data
US 2018/0286341 A1  Oct. 4, 2018

(30) Foreign Application Priority Data
Jul. 24, 2015 (JP) ................. 2015-146522

(51) Int. Cl.
*G09G 3/36* (2006.01)
*H01L 27/12* (2006.01)
(Continued)

(52) U.S. Cl.
CPC ......... *G09G 3/3677* (2013.01); *G09G 3/3688* (2013.01); *H01L 27/1225* (2013.01);
(Continued)

(58) Field of Classification Search
None
See application file for complete search history.

(56) References Cited

U.S. PATENT DOCUMENTS

| 5,767,832 A | 6/1998 | Koyama et al. |
| 2012/0112045 A1 | 5/2012 | Tsubuku et al. |

(Continued)

FOREIGN PATENT DOCUMENTS

| JP | 07-239463 A | 9/1995 |
| JP | 10-143118 A | 5/1998 |

(Continued)

OTHER PUBLICATIONS

English translation of Japanese Patent Publication JP10-143118A.*
(Continued)

*Primary Examiner* — Nicholas J Lee (57) ABSTRACT

A still row discrimination unit 15 discriminates whether data of one row included in a video signal D1 is a still row. A scanning line drive circuit 13 applies a non-selection voltage to scanning lines GL1 to GLm corresponding to the still row. A data line drive circuit 14 does not apply data voltages to data lines SL1 to SLn when discriminated as the still row. A similar structure may be applied to a display device in which pixel circuits are divided into a plurality of blocks in a row direction and the pixel circuits in a same block among the pixel circuits in each row are connected to each scanning line. With this, it is possible to provide a display device which can reduce power consumption even when a part of a display image changes.

14 Claims, 7 Drawing Sheets

(51) Int. Cl.
*H01L 29/24* (2006.01)
*H01L 29/786* (2006.01)

(52) U.S. Cl.
CPC .......... *H01L 27/1244* (2013.01); *H01L 29/24* (2013.01); *H01L 29/7869* (2013.01); *G09G 2320/103* (2013.01); *G09G 2330/021* (2013.01)

(56) References Cited

U.S. PATENT DOCUMENTS

| | | |
|---|---|---|
| 2012/0138922 A1 | 6/2012 | Yamazaki et al. |
| 2013/0320334 A1 | 12/2013 | Yamazaki et al. |
| 2014/0286076 A1 | 9/2014 | Aoki et al. |
| 2014/0368484 A1 | 12/2014 | Tanaka et al. |
| 2014/0375622 A1 | 12/2014 | Nakagawa et al. |
| 2015/0255040 A1 | 9/2015 | Inada et al. |

FOREIGN PATENT DOCUMENTS

| | | |
|---|---|---|
| JP | 2002-149104 A | 5/2002 |
| JP | 2012-114428 A | 6/2012 |
| JP | 2012-134475 A | 7/2012 |
| JP | 2014-007399 A | 1/2014 |
| JP | 2014-209727 A | 11/2014 |
| WO | 2013/115088 A1 | 8/2013 |
| WO | 2013/118323 A1 | 8/2013 |
| WO | 2014/050291 A1 | 4/2014 |

OTHER PUBLICATIONS

English translation of Japanese Patent Publication JP2002149104A.*
Official Communication issued in International Patent Application No. PCT/JP2016/070937, dated Oct. 18, 2016.

* cited by examiner

DISPLAY DEVICE AND DRIVE METHOD THEREFOR

TECHNICAL FIELD

The present invention relates to a display device, especially to a display device having a function of suspending drive of a display panel, and a drive method therefor.

BACKGROUND ART

A display panel included in a display device is driven at a predetermined frame frequency. In a typical display device, the display panel is driven at a frame frequency of 60 Hz. Power consumption of the display device increases, as a number of times of driving the display panel increases. Therefore, as a method for reducing the power consumption of the display device, there is known a method of suspending drive of the display panel when a same image is displayed continuously. This method is called a suspend drive, a low-frequency drive, an intermittent drive, or the like.

Furthermore, a technique of forming a thin film transistor (hereinafter referred to as TFT) included in a pixel circuit of the display device using an oxide semiconductor has been put to practical use. For example, indium gallium zinc oxide (InGaZnO) including indium (In), gallium (Ga), zinc (Zn), or the like is used as the oxide semiconductor. The TFT using the oxide semiconductor has a feature that a leakage current when the TFT is in an off state is small. Therefore, by performing the suspend drive in the display device having the pixel circuit including the TFT using the oxide semiconductor, the number of times of driving the display panel can be reduced greatly and the power consumption of the display device can be reduced greatly, while maintaining a display quality.

A display device performing the suspend drive is described in Patent Document 1, for example. Furthermore, related to the present invention, Patent Document 2 discloses a display device which repeats a processing for selecting, as a next row, a row having a smallest total amount of potential variation from a reference row and using the selected row as a next reference row, in order to reduce power consumption.

PRIOR ART DOCUMENTS

Patent Documents

[Patent Document 1] WO2013/115088
[Patent Document 2] WO2013/118323

SUMMARY OF THE INVENTION

Problems to be Solved by the Invention

A conventional display device performing the suspend drive discriminates whether to suspend drive of the display panel for each image (for each frame). Therefore, when an entire display image is a still image, the drive of the display panel can be suspended and the power consumption of the display device can be reduced. However, if most of the display image is the still image and a part of the display image changes, the drive of the display panel can not be suspended and the power consumption of the display device can not be reduced. The conventional display device performing the suspend drive has a problem that the power consumption can not be reduced when a part of the display image changes.

Accordingly, an object of the present invention is to provide a display device which can reduce power consumption even when a part of a display image changes.

Means for Solving the Problems

According to a first aspect of the present invention, there is provided a display device including: a display panel including a plurality of pixel circuits arranged in a row direction and a column direction, a plurality of scanning lines each connected to all or a part of the pixel circuits in each row, and a plurality of data lines each connected to the pixel circuits in each column; a scanning line drive circuit configured to apply a selection voltage to the scanning line selected from the plurality of the scanning lines; a data line drive circuit configured to apply data voltages in accordance with a video signal to the plurality of the data lines; and a discrimination unit configured to discriminate whether a portion of the video signal corresponding to each scanning line is a still portion, wherein the scanning line drive circuit is configured to apply a non-selection voltage to the scanning line corresponding to the portion discriminated as the still portion by the discrimination unit.

According to a second aspect of the present invention, in the first aspect of the present invention, the data line drive circuit is configured not to apply the data voltage to the data line corresponding to the portion discriminated as the still portion by the discrimination unit.

According to a third aspect of the present invention, in the second aspect of the present invention, the pixel circuits in each row are connected to the scanning line.

According to a fourth aspect of the present invention, in the second aspect of the present invention, the display panel is divided into a plurality of blocks in the row direction, and the pixel circuits in a same block among the pixel circuits in each row are connected to the scanning line.

According to a fifth aspect of the present invention, in the fourth aspect of the present invention, the display panel has a first side and a second side extending in the column direction and is divided into an even number of blocks in the row direction, among the scanning lines, a first scanning line connected to the pixel circuits in the block on a side of the first side is pulled out from the first side, and a second scanning line connected to the pixel circuits in the block on a side of the second side is pulled out from the second side, and the scanning line drive circuit includes a first drive unit configured to drive the first scanning line and a second drive unit configured to drive the second scanning line.

According to a sixth aspect of the present invention, in the fifth aspect of the present invention, the first scanning line is arranged at a position closer to the pixel circuits as the block including the pixel circuits connected to the first scanning line is closer to the first side, and the second scanning line is arranged at a position closer to the pixel circuits as the block including the pixel circuits connected to the second scanning line is closer to the second side.

According to a seventh aspect of the present invention, in the second aspect of the present invention, the data line drive circuit is configured not to apply any voltage to the data line corresponding to the portion discriminated as the still portion by the discrimination unit.

According to an eighth aspect of the present invention, in the second aspect of the present invention, the data line drive circuit is configured to apply a same voltage as that applied in an immediately preceding horizontal period, to the data line corresponding to the portion discriminated as the still portion by the discrimination unit.

According to a ninth aspect of the present invention, in the second aspect of the present invention, a number of times that the discrimination unit consecutively discriminates the portion corresponding to each scanning line as the still portion is limited.

According to a tenth aspect of the present invention, in the first aspect of the present invention, the pixel circuit includes a thin film transistor having an oxide semiconductor layer.

According to an eleventh aspect of the present invention, in the tenth aspect of the present invention, the thin film transistor is a channel etch type thin film transistor.

According to a twelfth aspect of the present invention, in the tenth aspect of the present invention, the oxide semiconductor layer is formed of indium gallium zinc oxide.

According to a thirteenth aspect of the present invention, in the tenth aspect of the present invention, the oxide semiconductor layer is formed of a crystalline oxide semiconductor.

According to a fourteenth aspect of the present invention, in the tenth aspect of the present invention, the oxide semiconductor layer has a laminated structure.

According to a fifteenth aspect of the present invention, there is provided a drive method for a display device having a display panel including a plurality of pixel circuits arranged in a row direction and a column direction, a plurality of scanning lines each connected to all or a part of the pixel circuits in each row, and a plurality of data lines each connected to the pixel circuits in each column, the drive method including the steps of: applying a selection voltage to the scanning line selected from among the plurality of the scanning lines; applying data voltages in accordance with a video signal to the plurality of the scanning lines; and discriminating whether a portion of the video signal corresponding to each scanning line is a still portion, wherein in applying the selection voltage, a non-selection voltage is applied to the scanning line corresponding to the portion discriminated as the still portion.

According to a sixteenth aspect of the present invention, in the fifteenth aspect of the present invention, in applying the data voltages, the data voltage is not applied to the data line corresponding to the portion discriminated as the still portion.

Effects of the Invention

According to the first or fifteenth aspect of the present invention, even when a part of a display image changes, drive of the scanning line corresponding to the still portion can be suspended, and power consumption of the display device can be reduced.

According to the second or sixteenth aspect of the present invention, even when a part of the display image changes, drive of the scanning line and the data line corresponding to the still portion can be suspended, and the power consumption of the display device can be reduced.

According to the third aspect of the present invention, it is possible to discriminate whether it is the still portion for each row of the video signal and reduce the power consumption of the display device.

According to the fourth aspect of the present invention, it is possible to discriminate whether it is the still portion for each portion of the row of the video signal and reduce the power consumption of the display device more effectively.

According to the fifth aspect of the present invention, the scanning lines can be laid out easily by pulling out the scanning lines separately from two sides of the display panel.

According to the sixth aspect of the present invention, by arranging, close to the pixel circuits, the scanning line connected to the pixel circuits in the block close to an end of the display panel, it is possible to prevent a wiring connecting the scanning line and the pixel circuit from intersecting with other wirings and manufacture the display panel easily.

According to the seventh aspect of the present invention, power consumption due to a change in a voltage of the data line can be reduced by not applying any voltage to the data line corresponding to the still portion.

According to the eighth aspect of the present invention, the power consumption due to the change in the voltage of the data line can be reduced by applying the same voltage as that applied in the immediately preceding horizontal period, to the data line corresponding to the still portion.

According to the ninth aspect of the present invention, by limiting the number of times of consecutively discriminating as the still portion, it is possible to write the data voltage to the pixel circuit corresponding to the still portion at a predetermined time interval and maintain the display quality.

According to the tenth to fourteenth aspects of the present invention, by using the thin film transistor having the oxide semiconductor layer, it is possible to greatly reduce a number of times of driving the display panel and greatly reduce the power consumption of the display device, while maintaining the display quality.

MODES FOR CARRYING OUT THE INVENTION

First Embodiment

Figure 1:
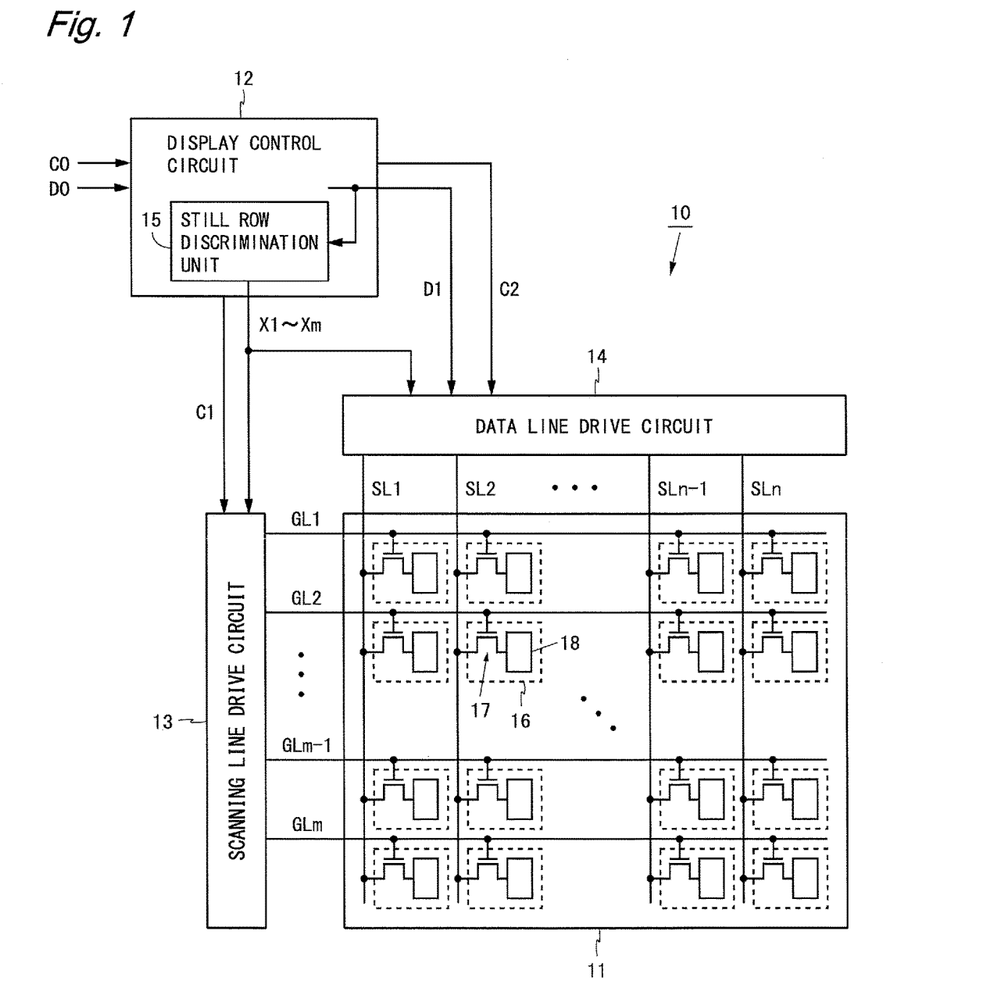
FIG. 1 is a block diagram showing a configuration of a liquid crystal display device according to a first embodiment of the present invention.

FIG. 1 is a block diagram showing a configuration of a liquid crystal display device according to a first embodiment of the present invention. A liquid crystal display device 10 shown in FIG. 1 includes a liquid crystal panel 11, a display control circuit 12, a scanning line drive circuit 13, and a data line drive circuit 14. In the following, it is assumed that m and n are integers not less than 2, i is an integer not less than 1 and not more than m, and j is an integer not less than 1 and not more than n.

The liquid crystal panel 11 includes m scanning lines GL1 to GLm, n data lines SL1 to SLn, and (m×n) pixel circuits 16. The scanning lines GL1 to GLm extend in a row direction (horizontal direction in the drawings) and are arranged in parallel to each other. The data lines SL1 to SLn extend in a column direction (vertical direction in the drawings) and are arranged in parallel to each other so as to intersect with the scanning lines GL1 to GLm perpendicularly. The scanning lines GL1 to GLm and the data lines SL1 to SLn intersect at (m×n) points. The (m×n) pixel circuits 16 are provided corresponding to intersections of the scanning lines GL1 to GLm and the data lines SL1 to SLn. In this manner, the (m×n) pixel circuits 16 are arranged in the row direction and the column direction. The pixel circuit 16 includes a TFT 17 and a pixel electrode 18. The TFT 17 in an i-th row and a j-th column has a gate terminal connected to a scanning line GLi, a source terminal connected to a data line SLj, and a drain electrode connected to the pixel electrode 18. Note that all or a part of the scanning line drive circuit 13 and the data line drive circuit 14 may be formed on the liquid crystal panel 11 together with the pixel circuit 16.

The display control circuit 12 is a control circuit of the liquid crystal display device 10. The display control circuit 12 receives a control signal C0 and a video signal D0 supplied from an outside of the liquid crystal display device 10. Based on the control signal C0 and the video signal D0, the display control circuit 12 outputs a control signal C1 to the scanning line drive circuit 13, and outputs a control signal C2 and a video signal D1 to the data line drive circuit 14. The control signal C1 includes a gate start pulse and a gate clock, for example. The control signal C2 includes a source start pulse and a source clock, for example. The video signal D1 may be a same signal as the video signal D0 or a signal obtained by applying a video signal processing to the video signal D0.

Hereinafter, when data in a certain row in a certain frame included in the video signal D1 used for driving the liquid crystal panel 11 is not changed from that in a previous frame, the row is referred to as "still row". The display control circuit 12 includes a still row discrimination unit 15 for discriminating whether it is the still row, based on the video signal D1. The still row discrimination unit 15 stores a video signal of the previous frame, compares data of each row included in the video signal D1 of a current frame with data of the row at a same position included in the video signal of the previous frame, and discriminates whether each row is the still row. For example, the still row discrimination unit 15 may discriminate as the still row when two data (data of two rows) match completely, may discriminate as the still row when a maximum value of a difference between the two data is not more than a threshold value, or may discriminate as the still row when a sum of the differences between the two data is not more than a threshold value. The still row discrimination unit 15 outputs m discrimination results X1 to Xm each indicating a discrimination result of each row, to the scanning line drive circuit 13 and the data line drive circuit 14. In the following, it is assumed that a discrimination result Xi is 1 when the i-th row is the still row, and is 0 otherwise.

In the liquid crystal display device 10, a number of times that the still row discrimination unit 15 consecutively discriminates as the still row for each row is limited. The still row discrimination unit 15 discriminates all of the rows in the frame as a non-still row at a predetermined period, or discriminates a certain row as the non-still row after consecutively discriminating the row as the still row a certain number of times.

The scanning line drive circuit 13 drives the scanning lines GL1 to GLm based on the control signal C1. One frame period includes m horizontal periods. In an i-th horizontal period, the scanning line drive circuit 13 applies, to the scanning line GLi, a voltage with which the TFT 17 turns on (for example, high level voltage; hereinafter referred to as selection voltage), and applies, to other (m−1) scanning lines, a voltage with which the TFT 17 turns off (for example, low level voltage; hereinafter referred to as non-selection voltage). In this manner, the scanning line drive circuit 13 sequentially selects one scanning line from among the scanning lines GL1 to GLm, and applies the selection voltage to the selected scanning line in one horizontal period. As a result, n pixel circuits connected to the scanning line to which the selection voltage is applied are selected collectively.

The data line drive circuit 14 drives the data lines SL1 to SLn based on the control signal C2 and the video signal D1. More specifically, based on the control signal C2, the data line drive circuit 14 respectively applies n data voltages in accordance with the video signal D1 to the data lines SL1 to SLn. With this, the n data voltages are written to the n selected pixel circuits, respectively.

When the still row discrimination unit 15 discriminates as the still row, the scanning line drive circuit 13 applies the non-selection voltage to the corresponding scanning line, and the data line drive circuit 14 does not apply the data voltages to the data lines SL1 to SLn. Specifically, when the discrimination result Xi is 1, the scanning line drive circuit 13 applies the non-selection voltage to all of the scanning lines GL1 to GLm (including the scanning line GLi) in the i-th horizontal period. The data line drive circuit 14 does not apply any voltage to the data lines SL1 to SLn, or applies same voltages as those applied in an immediately preceding horizontal period (does not change voltages applied to the data lines SL1 to SLn).

Figure 2:
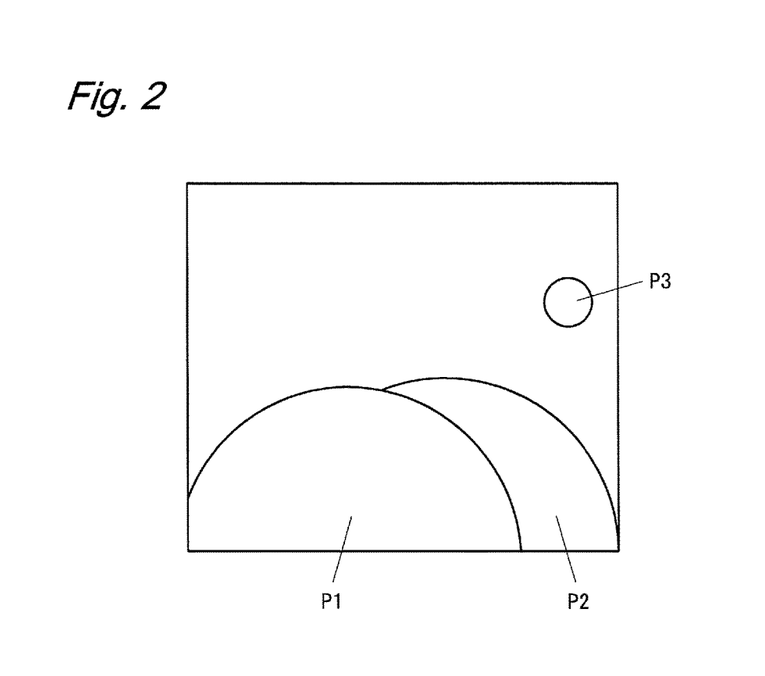
FIG. 2 is a diagram showing an example of a display image.

FIG. 2 is a diagram showing an example of a display image. The display image shown in FIG. 2 is one of continuous images showing a manner in which a circular object P3 (representing the moon) moves in a fixed background image including two semicircular objects P1, P2 (representing mountains). In this case, the display image changes at and near the object P3, but does not change in other portions.

The conventional liquid crystal display device discriminates whether to suspend drive of the liquid crystal panel for each image (for each frame). The conventional liquid crystal display device suspends the drive of the liquid crystal panel when an entire display image is a still image, and drives the liquid crystal panel otherwise. Therefore, when only a part of the display image changes as shown in FIG. 2, the drive of the liquid crystal panel can not be suspended, and power consumption of the liquid crystal display device can not be reduced. Thus, the conventional liquid crystal display device has a problem that power consumption can not be reduced when a part of the display image changes.

Figure 3:
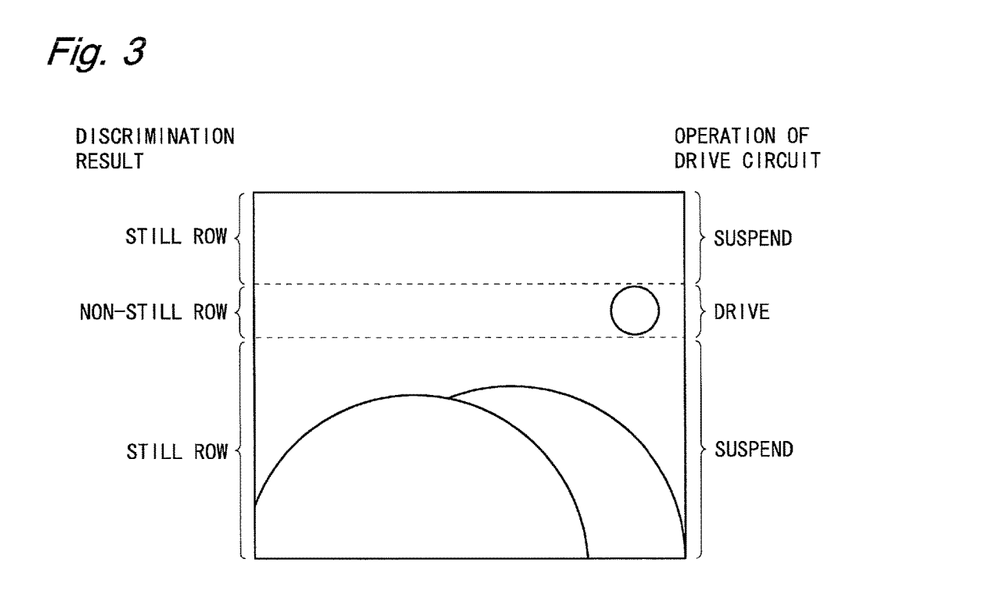
FIG. 3 is a diagram showing a discrimination result and an operation state of a drive circuit in the liquid crystal display device according to the first embodiment.

In contrast, the liquid crystal display device 10 according to the present embodiment discriminates whether to suspend the drive of the liquid crystal panel 11 for each row. The liquid crystal display device 10 discriminates whether it is the still row for each row, and applies the non-selection voltage to the scanning lines and does not apply the data voltages to the data lines when discriminated as the still row. FIG. 3 is a diagram showing a discrimination result and an operation state of the drive circuit in the liquid crystal display device 10. When displaying the image shown in FIG. 2, the liquid crystal display device 10 discriminates a row including a part of the object P3 as the non-still row, discriminates a row not including the object P3 as the still row, and applies the non-selection voltage to the scanning lines and does not apply the data voltages to the data lines when discriminated as the still row. According to the liquid crystal display device 10 according to the present embodiment, by performing a processing of suspending the drive of the liquid crystal panel 11 for each row, power consumption can be reduced even when a part of the display image changes.

Note that in the liquid crystal display device 10, a TFT having a semiconductor layer formed of an oxide semiconductor, such as indium gallium zinc oxide, may be used as the TFT 17 in the pixel circuit 16. The TFT using the oxide semiconductor has a small leakage current when the TFT is in an off state. Therefore, by using the oxide semiconductor TFT, a number of times of driving the liquid crystal panel 11 can be reduced greatly and the power consumption of the liquid crystal display device 10 can be reduced greatly, while maintaining a display quality.

As described above, the liquid crystal display device 10 according to the present embodiment includes a display panel (liquid crystal panel 11) including a plurality of the pixel circuits 16 arranged in the row direction and the column direction, a plurality of the scanning lines GL1 to GLm each connected to all of the pixel circuits 16 in each row, and a plurality of the data lines SL1 to SLn connected to the pixel circuits 16 in each column, the scanning line drive circuit 13 for applying the selection voltage to the scanning line selected from the plurality of the scanning lines GL1 to GLm, the data line drive circuit 14 for applying the data voltages in accordance with the video signal D1 to the plurality of the data lines SL1 to SLn, and a discrimination unit (still row discrimination unit 15) for discriminating whether a portion of the video signal D1 corresponding to each scanning line (data of one line) is the still portion (still row). The scanning line drive circuit 13 applies the non-selection voltage to the scanning line corresponding to the portion discriminated as the still portion by the discrimination unit. Therefore, even when a part of the displayed image changes, drive of the scanning line corresponding to the still portion can be suspended, and power consumption of the liquid crystal display device 10 can be reduced.

Furthermore, the data line drive circuit 14 does not apply the data voltages to the data lines SL1 to SLn when discriminated as the still portion by the discrimination unit. Therefore, even when a part of the display image changes, drive of the scanning line and the data lines SL1 to SLn corresponding to the still portion can be suspended, and the power consumption of the liquid crystal display device 10 can be reduced.

Furthermore, the pixel circuits 16 in each row are connected to one of the scanning lines GL1 to GLm. Therefore, it is possible to discriminate whether it is the still portion for each row of the video signal D1 and reduce the power consumption of the liquid crystal display device 10. Furthermore, when discriminated as the still portion by the discrimination unit, the data line drive circuit 14 does not apply any voltage to the data lines SL1 to SLn or applies the same voltages as those applied in the immediately preceding horizontal period. Therefore, power consumption due to changes in voltages of the data lines SL1 to SLn can be reduced. In addition, the number of times that the discrimination unit consecutively discriminates the portion corresponding to each scanning line as the still portion is limited. Therefore, it is possible to write the data voltage to the pixel circuit 16 corresponding to the still portion at a predetermined time interval and maintain the display quality.

Second Embodiment

Figure 4:
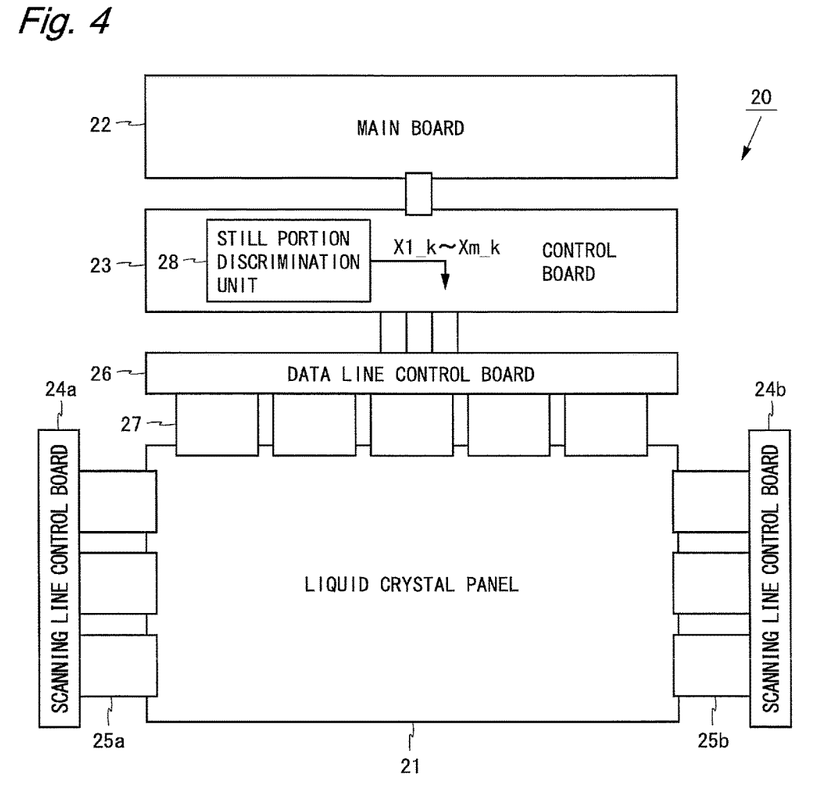
FIG. 4 is a block diagram showing a configuration of a liquid crystal display device according to a second embodiment of the present invention.

FIG. 4 is a block diagram showing a configuration of a liquid crystal display device according to a second embodiment of the present invention. A liquid crystal display device 20 shown in FIG. 4 includes a liquid crystal panel 21, a main board 22, a control board 23, scanning line control boards 24a, 24b, scanning line drive circuits 25a, 25b, a data line control board 26, and a data line drive circuit 27.

The liquid crystal panel 21 includes 4 m scanning lines, n data lines, and (m×n) pixel circuits (none of them are shown). Details of the liquid crystal panel 21 will be described later.

The main board 22 is connected to an antenna, a communication line, or the like (not shown). A broadcast wave including a video signal is input to the main board 22 via the antenna, the communication line, or the like. A circuit (not shown) on the main board 22 extracts the video signal from the broadcast wave by performing a predetermined signal processing, a conversion processing, and the like on the input broadcast wave. A circuit (not shown) on the control board 23 generates a signal for driving the liquid crystal panel 21 by performing a predetermined processing on the video signal output from the main board 22. A display control circuit (not shown) including a still portion discrimination unit 28 is provided on the control board 23. Details of the still portion discrimination unit 28 will be described later.

The liquid crystal panel 21 has a first side and a second side (left side and right side in the drawings) extending in the column direction. The scanning line control board 24a and the scanning line drive circuit 25a are provided along the first side of the liquid crystal panel 21. The scanning line control board 24b and the scanning line drive circuit 25b are provided along the second side of the liquid crystal panel 21. Circuits (not shown) on the scanning line control boards 24a, 24b respectively supply control signals (not shown) to the scanning line drive circuits 25a, 25b based on the signal output from the circuit on the control board 23. The scanning line drive circuit 25a is connected to first ends (left ends in the drawings) of the scanning lines on the liquid crystal panel 21, and drives the scanning lines from a first-end side based on the control signal output from the circuit on the scanning line control board 24a. The scanning line drive circuit 25b is connected to second ends (right ends in the drawings) of the scanning lines on the liquid crystal panel 21, and drives the scanning lines from a second-end side based on the control signal output from the circuit on the scanning line control board 24b.

Based on the signal output from the circuit on the control board 23, a circuit (not shown) on the data line control board 26 supplies a control signal and a video signal (both are not shown) to the data line drive circuit 27. The data line drive circuit 27 drives the data lines on the liquid crystal panel 21.

Figure 5:
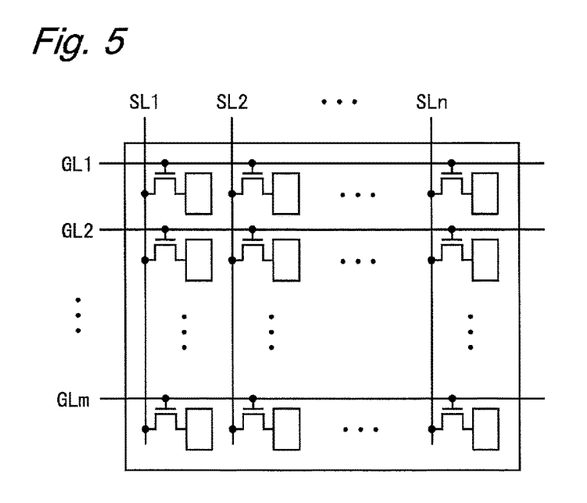
FIG. 5 is a diagram showing a configuration of a liquid crystal panel according to a reference example.

FIG. 5 is a diagram showing a configuration of a liquid crystal panel according to a reference example. As with the liquid crystal panel 11 according to the first embodiment, the liquid crystal panel shown in FIG. 5 has the m scanning lines GL1 to GLm, the n data lines SL1 to SLn, and the (m×n) pixel circuits. Scanning line drive circuits (not shown) are provided along a left side and a right side of the liquid crystal panel, left ends of the scanning lines GL1 to GLm are connected to a left-side scanning line drive circuit, right ends of the scanning lines GL1 to GLm are connected to a right-side scanning line drive circuit, and the scanning lines GL1 to GLm are driven from both ends. Note that a scanning line drive circuit may be provided only on the left side or the right side of the liquid crystal panel, the left ends or the right ends of the scanning lines GL1 to GLm may be connected to the scanning line drive circuit, and the scanning lines GL1 to GLm may be driven from the left end or the right end.

Figure 6:
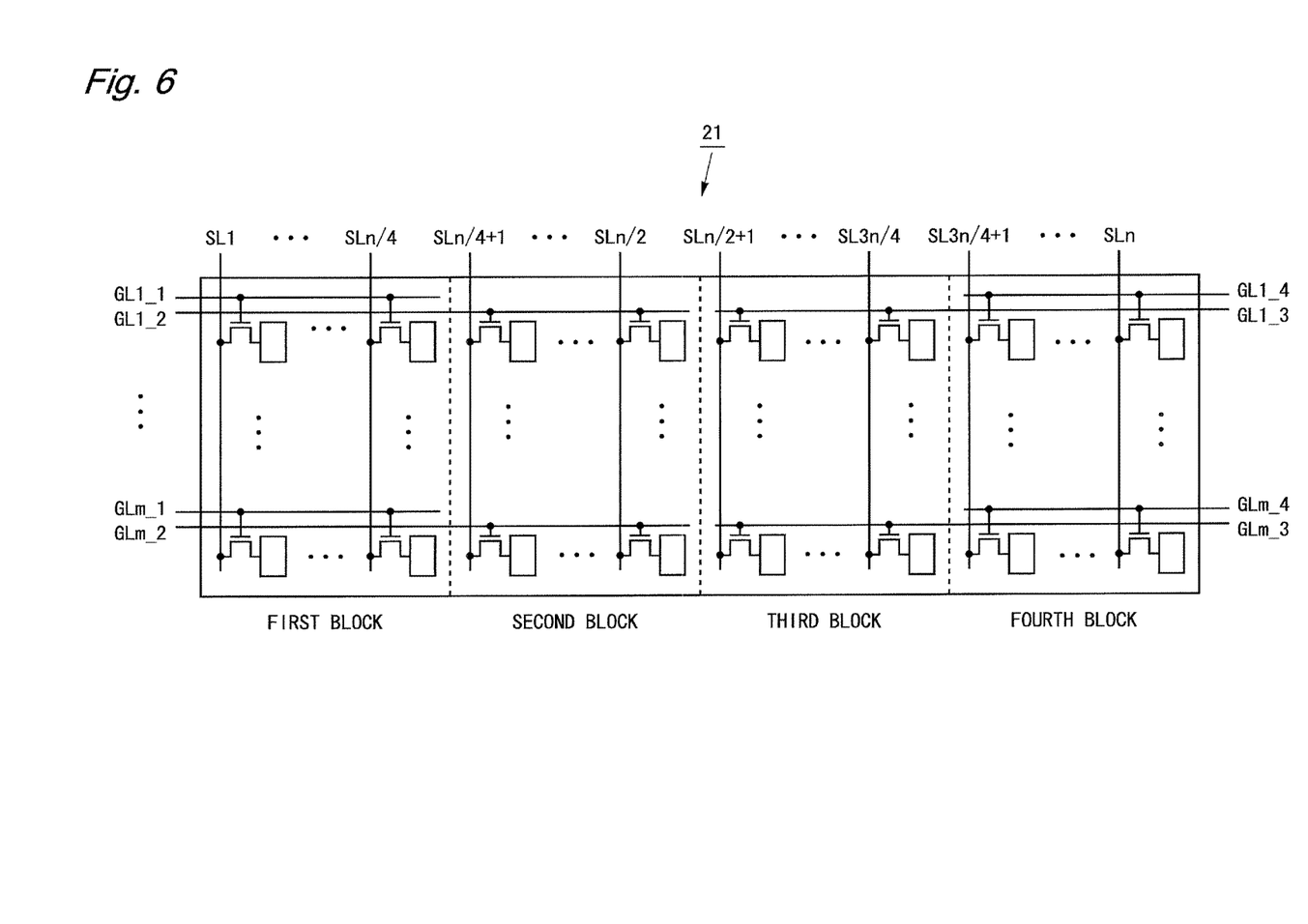
FIG. 6 is a diagram showing a configuration of a liquid crystal panel of the liquid crystal display device according to the second embodiment.

FIG. 6 is a diagram showing a configuration of the liquid crystal panel 21 according to the present embodiment. As described above, the liquid crystal panel 21 includes the 4 m scanning lines, the n data lines SL1 to SLn, and the (m×n) pixel circuits. The liquid crystal panel 21 is divided into four blocks in the row direction, and includes four scanning lines corresponding to the pixel circuits in one row. Hereinafter, the four blocks are referred to as first to fourth blocks in an order from left, and four scanning lines corresponding to the pixel circuits in the i-th row are referred to as GLi_1 to GLi_4.

Scanning lines GL1_1 to GLm_1 are provided in the first block. Scanning lines GL1_2 to GLm_2 are provided in the first and second blocks. The first ends (left ends in the drawings) of the scanning lines GL1_1 to GLm_1, GL1_2 to GLm_2 are pulled out from the first side of the liquid crystal panel 21. The scanning lines GL1_1 to GLm_1, GL1_2 to GLm_2 are arranged in an order of GL1_1, GL1_2, GL2_1, GL2_2, . . . , GLm_1, GLm_2. Among the pixel circuits in the i-th row, the pixel circuits in the first and second blocks are arranged between the scanning line GLi_2 and a scanning line GLi+1_1.

Scanning lines GL1_3 to GLm_3 are provided in the third and fourth blocks. Scanning lines GL1_4 to GLm_4 are provided in the fourth block. The second ends (right ends in the drawing) of the scanning lines GL1_3 to GLm_3, GL1_4 to GLm_4 are pulled out from the second side of the liquid crystal panel 21. The scanning lines GL1_3 to GLm_3, GL1_4 to GLm_4 are arranged in an order of GL1_4, GL1_3, GL2_4, GL2_3, . . . , GLm_4, GLm_3. Among the pixel circuits in the i-th row, the pixel circuits in the third and fourth blocks are arranged between the scanning line GLi_3 and a scanning line GLi+1_4.

The source terminal of the TFT in the pixel circuit in the j-th column is connected to the data line SLj. Among the pixel circuits in the i-th row, gate terminals of the TFTs in the pixel circuits in the first block are connected to the scanning line GLi_1. The pixel circuits in the first block are driven using the scanning line GLi_1 and data lines SL1 to SLn/4. Gate terminals of the TFTs in the pixel circuits in the second block are connected to the scanning line GLi_2. The pixel circuits in the second block are driven using the scanning line GLi_2 and data lines SLn/4+1 to SLn/2. Gate terminals of the TFTs in the pixel circuits in the third block are connected to the scanning line GLi_3. The pixel circuits in the third block are driven using the scanning line GLi_3 and data lines SLn/2+1 to SL3n/4. Gate terminals of the TFTs in the pixel circuits in the fourth block are connected to the scanning line GLi_4. The pixel circuits in the fourth block are driven using the scanning line GLi_4 and data lines SL3n/4+1 to SLn.

Hereinafter, when data in a certain quarter row in a certain frame included in the video signal used for driving the liquid crystal panel 21 is not changed from that in the previous frame, the quarter row is referred to as "still portion". The still portion discrimination unit 28 shown in FIG. 4 discriminates whether it is the still portion, based on the video signal. More specifically, the still portion discrimination unit 28 stores the video signal of the previous frame, compares data of each quarter row included in the video signal of the current frame with data of the quarter row at a same position included in the previous frame, and discriminates whether each quarter row is the still portion. As with the still row discrimination unit 15 according to the first embodiment, the still portion discrimination unit 28 may discriminate as the still portion when two data (data of two quarter rows) match completely, when a maximum value of a difference between the two data is not more than a threshold value, or when a sum of the differences between the two data is not more than a threshold value. The still portion discrimination unit 28 outputs 4 m discrimination results X1_k to Xm_k (k is an integer not less than 1 and not more than 4) each indicating a discrimination result of each quarter row. In the following, it is assumed that a discrimination result Xi_k is 1 when a quarter row in the i-th row corresponding to a k-th block is the still portion, and is 0 otherwise.

In the i-th horizontal period, the scanning line drive circuit 25a applies the selection voltage to the scanning lines GLi_1, GLi_2 and applies the non-selection voltage to other (2 m−2) scanning lines. At this time, the scanning line drive circuit 25b applies the selection voltage to the scanning lines GLi_3, GLi_4 and applies the non-selection voltage to other (2 m−2) scanning lines. With this, n pixel circuits connected to four scanning lines to which the selection voltage is applied are selected collectively. The data line drive circuit 27 applies n data voltages in accordance with the video signal to the data lines SL1 to SLn, respectively. With this, n data voltages are written to the n selected pixel circuits, respectively.

When the still portion discrimination unit 28 discriminates as the still portion, the scanning line drive circuits 25a, 25b apply the non-selection voltage to the corresponding scanning line, and the data line drive circuit 27 does not apply the data voltages to the corresponding data lines. Specifically, when the discrimination result Xi_k is 1, the scanning line drive circuit 25a or 25b applies the non-selection voltage to a scanning line GLi_k in the i-th horizontal period. The data line drive circuit 27 does not apply any voltage to n/4 data lines corresponding to the k-th block among the data lines SL1 to SLn, or applies same voltages as those applied in the immediately preceding line period.

Figure 7:
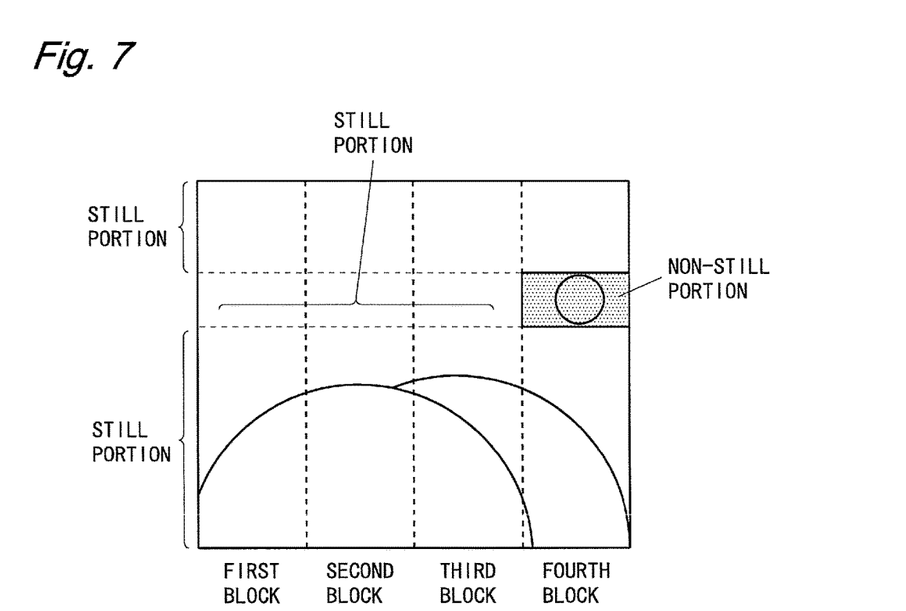
FIG. 7 is a diagram showing a discrimination result in the liquid crystal display device according to the second embodiment.

FIG. 7 is a diagram showing a discrimination result in the liquid crystal display device 20. When displaying the image shown in FIG. 2, the liquid crystal display device 20 discriminates a quarter row including a part of the object P3 as the non-still portion (dot pattern portion), discriminates a quarter row not including the object P3 as the still portion, applies the non-selection voltage to the scanning line corresponding to the still portion, and does not apply the data voltages to the data lines corresponding to the still portion. According to the liquid crystal display device 20 according to the present embodiment, by performing the processing of suspending the drive of the liquid crystal panel 21 for each quarter row, power consumption can be reduced more effectively even when a part of the display image changes.

As described above, in the liquid crystal display device 20 according to the present embodiment, the plurality of pixel circuits are divided into a plurality of blocks (four blocks) in the row direction (extending direction of the scanning line), and the pixel circuits in a same block (part of the pixel circuits in each row) are connected to one of the scanning lines GL1 to GLm. Therefore, it is possible to discriminate whether it is the still portion for each portion of the row of the video signal and reduce power consumption of the liquid crystal display device 20 more effectively.

Furthermore, the display panel (liquid crystal panel 21) has a first side (left side) and a second side (right side) extending in the column direction (extending direction of the data line) and is divided into an even number of blocks (four blocks). Among the scanning lines GL1 to GLm, a first scanning line (scanning lines GL1_1 to GLm_1, GL1_2 to GLm_2) connected to the pixel circuits in the block of the first side (first and second blocks) are pulled out from the first side, and a second scanning line (scanning lines GL1_3 to GLm_3, GL1_4 to GLm_4) connected to the pixel circuits in the block of the second side (third and fourth blocks) are pulled out from the second side. The scanning line drive circuit 25 includes a first drive unit (scanning line drive circuit 25*a*) for driving the first scanning line and a second drive unit (scanning line drive circuit 25*b*) for driving the second scanning line. In this manner, the scanning lines can be laid out easily by pulling out the scanning lines separately from two sides of the display panel.

Note that in the liquid crystal display device 20, the liquid crystal panels 21 is divided into four blocks, four scanning lines are provided corresponding to the pixel circuits in one row, and the still portion discrimination unit 28 discriminates whether it is the still portion for each quarter row. Instead, the liquid crystal panel may be divided into s (s is an even number) blocks, s scanning lines may be provided corresponding to the pixel circuits in one row, and the still portion discrimination unit may discriminate whether it is the still portion for each 1/s row. As a value of s is larger, effect of reducing the power consumption of the display device is larger, although a number of scanning lines is increased.

Third Embodiment

A liquid crystal display device according to a third embodiment of the present invention has a same configuration as the liquid crystal display device according to the second embodiment (see FIG. 4). However, the liquid crystal display device according to the present embodiment includes a liquid crystal panel 31 shown in FIG. 8 in place of the liquid crystal panel 21.

Figure 8:
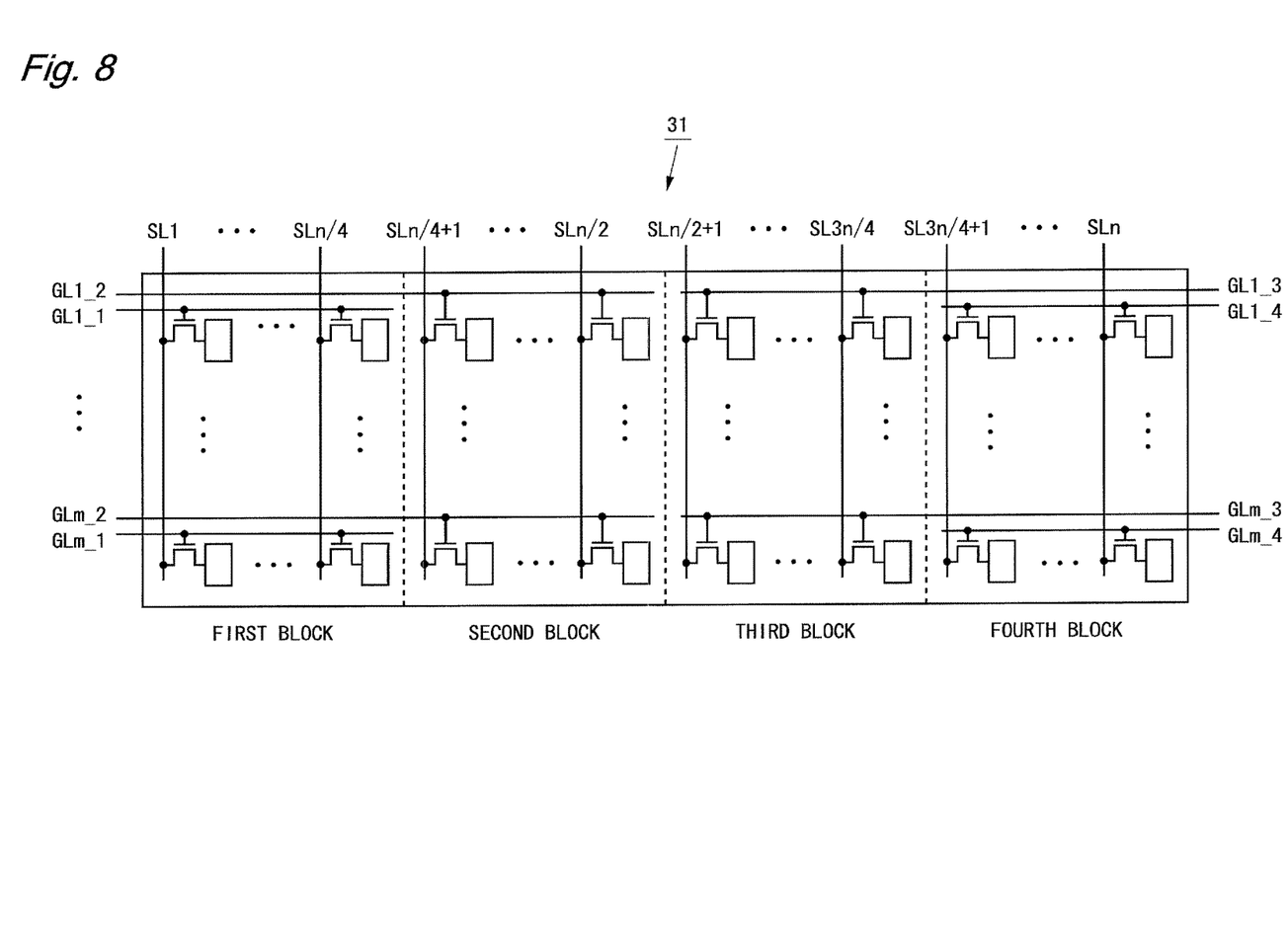
FIG. 8 is a diagram showing a configuration of a liquid crystal panel of a liquid crystal display device according to a third embodiment of the present invention.

As with the liquid crystal panel 21, the liquid crystal panel 31 shown in FIG. 8 includes the 4 m scanning lines GL1_1 to GLm_1, GL1_2 to GLm_2, GL1_3 to GLm_3, GL1_4 to GLm_4, the n data lines SL1 to SLn, and the (m×n) pixel circuits. The liquid crystal panel 31 is different from the liquid crystal panel 21 in the following points. The scanning lines GL1_1 to GLm_1, GL1_2 to GLm_2 are arranged in an order of GL1_2, GL1_1, GL2_2, GL2_1, . . . , GLm_2, GLm_1. Among the pixel circuits in the i-th row, the pixel circuits in the first and second blocks are provided between the scanning line GLi_1 and a scanning line GLi+1_2. The scanning lines GL1_3 to GLm_3, GL1_4 to GLm_4 are arranged in an order of GL1_3, GL1_4, GL2_3, GL2_4, . . . , GLm_3, GLm_4. Among the pixel circuits in the i-th row, the pixel circuits in the third and fourth blocks are provided between the scanning line GLi_4 and a scanning line GLi+1_3.

In the liquid crystal panel 21 according to the second embodiment, the scanning line GLi_1 is arranged at a position farther from the pixel circuits than the scanning line GLi_2, and the scanning line GLi_4 is arranged at a position farther from the pixel circuits than the scanning line GLi_3. Thus, as shown in FIG. 6, a wiring connecting the scanning line GLi_1 and the gate terminal of the TFT intersects with the scanning line GLi_2, and a wiring connecting the scanning line GLi_4 and the gate terminal of the TFT intersects with the scanning line GLi_3. As a result, a manufacturing process of the liquid crystal panel 21 becomes complicated.

In contrast, in the liquid crystal panel 31 according to the present embodiment, the scanning line GLi_1 is arranged at a position closer to the pixel circuits than the scanning line GLi_2, and the scanning line GLi_4 is arranged at a position closer to the pixel circuits than the scanning line GLi_3. In this manner, in the liquid crystal panel 31, the scanning lines GLi_1, GLi_2 are arranged at positions closer to the pixel circuits as the block including the pixel circuits connected to the scanning line is closer to the first side of the liquid crystal panel 31, and the scanning lines GLi_3, GLi_4 are arranged at positions closer to the pixel circuits as the block including the pixel circuits connected to the scanning line is closer to the second side of the liquid crystal panel 31. Therefore, in the liquid crystal panel 31, the wiring connecting the scanning line and the gate terminal of the TFT does not intersect with other scanning lines. Thus, the liquid crystal panel 31 according to the present embodiment can be manufactured more easily than the liquid crystal panel 21 according to the second embodiment.

As described above, in the liquid crystal display device according to the present embodiment, a first scanning line (scanning lines GL1_1 to GLm_1, GL1_2 to GLm_2) is arranged at a position closer to the pixel circuits as the block including the pixel circuits connected to the first scanning line is closer to the first side (left side of the liquid crystal panel 31), and a second scanning line (scanning lines GL1_3 to GLm_3, GL1_4 to GLm_4) is arranged at a position closer to the pixel circuits as the block including the pixel circuits connected to the second scanning line is closer to the second side (right side of the liquid crystal panel 31). Therefore, according to the liquid crystal display device according to the present embodiment, by arranging, close to the pixel circuits, the scanning line connected to the pixel circuits in the block close to an end of the display panel, it is possible to prevent the wiring connecting the scanning line and the pixel circuit from intersecting with other scanning lines and easily manufacture the display panel (liquid crystal panel 31).

In the following, the TFT included in the pixel circuit of the liquid crystal display device according to each embodiment of the present invention will be described. The pixel circuit may include a TFT having an oxide semiconductor layer. The TFT may be a channel etch type TFT or an etch stop type TFT. The oxide semiconductor layer of the TFT may be formed of indium gallium zinc oxide, may be formed of a crystalline oxide semiconductor, or may have a stacked structure. By using the TFT having the oxide semiconductor layer, a number of times of driving the liquid crystal panel can be reduced greatly and power consumption of the liquid crystal display device can be reduced greatly, while maintaining the display quality.

Figure 9:
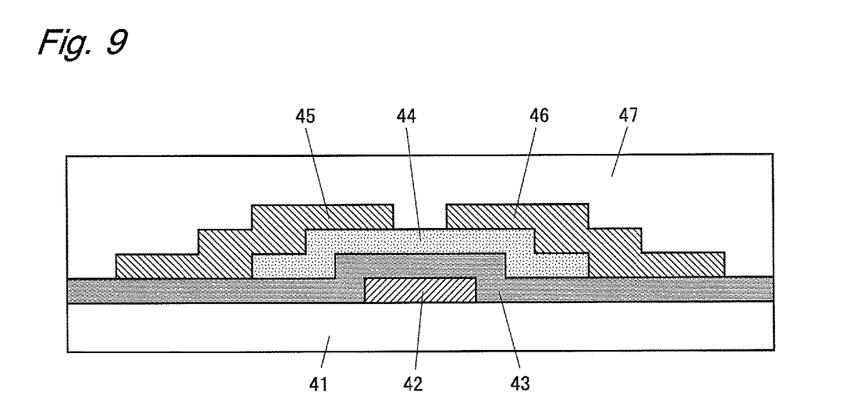
FIG. 9 is a diagram showing a configuration of a channel etch type TFT.

FIG. 9 is a diagram showing a configuration of the channel etch type TFT. As shown in FIG. 9, the channel etch type TFT has a structure in which a gate electrode 42, a gate insulating film 43, an oxide semiconductor layer 44, a source electrode 45, and a drain electrode 46 are stacked over a substrate 41, and a protective film 47 are formed thereon. A portion of the oxide semiconductor layer 44 existing above the gate electrode 42 functions as a channel region. In the channel etch type TFT, an etch stop layer is not formed on the channel region, and a lower surface of an end portion on a channel side of each of the source electrode 45 and the drain electrode 46 is arranged so as to contact with an upper surface of the oxide semiconductor layer 44. The channel etch type TFT is formed, for example, by forming a conductive film for the source and drain electrodes on the oxide semiconductor layer 44 and performing a source/drain separation process. In the source/drain separation process, a surface portion of the channel region may be etched.

In the etch stop type TFT (not shown), the etch stop layer is formed on the channel region. The lower surface of the end portion on the channel side of each of the source electrode and the drain electrode is located on the etch stop layer, for example. The etch stop type TFT is formed by, for example, after forming the etch stop layer which covers a portion to be the channel region in the oxide semiconductor layer, forming the conductive film for the source and drain electrodes on the oxide semiconductor layer and the etch stop layer, and performing the source/drain separation process.

The oxide semiconductor included in the oxide semiconductor layer of the TFT may be an amorphous oxide semiconductor or a crystalline oxide semiconductor having a crystalline portion. As the crystalline oxide semiconductor, there can be used a polycrystalline oxide semiconductor, a microcrystalline oxide semiconductor, a crystalline oxide semiconductor in which a c-axis is aligned so as to be substantially perpendicular to a layer surface, and the like.

The oxide semiconductor layer of the TFT may have a stacked structure of two or more layers. In this case, the oxide semiconductor layer may include an amorphous oxide semiconductor layer and a crystalline oxide semiconductor layer, may include a plurality of the crystalline oxide semiconductor layers having different crystal structures, or may include a plurality of the amorphous oxide semiconductor layers. When the oxide semiconductor layer has a two-layer structure including an upper layer and a lower layer, an energy gap of the oxide semiconductor included in the upper layer is preferably larger than an energy gap of the oxide semiconductor included in the lower layer. However, when a difference in the energy gaps between the two layers is relatively small, the energy gap of the lower oxide semiconductor may be larger than the energy gap of the upper oxide semiconductor.

A material, a structure, a film forming method of the amorphous oxide semiconductor and each of the above-described crystalline oxide semiconductors, a structure of the oxide semiconductor layer having the stacked structure, and the like are described in Japanese Laid-Open Patent Publication No. 2014-7399. For reference, all of the disclosure contents of Japanese Laid-Open Patent Publication No. 2014-7399 is incorporated herein by reference.

The oxide semiconductor layer may include, for example, at least one metal element selected from In, Ga, and Zn. The oxide semiconductor layer includes, for example, an In—Ga—Zn—O based semiconductor (for example, indium gallium zinc oxide). The In—Ga—Zn—O based semiconductor is a ternary oxide of In (indium), Ga (gallium), and Zn (zinc). A ratio (composition ratio) of In, Ga, and Zn is not especially limited and may be, for example, In:Ga:Zn=2:2:1, In:Ga:Zn=1:1:1, In:Ga:Zn=1:1:2, or the like. The oxide semiconductor layer is formed using an oxide semiconductor film including the In—Ga—Zn—O based semiconductor. Note that the channel etch type TFT having an active layer including the oxide semiconductor (Oxide Semiconductor: OS) such as the In—Ga—Zn—O based semiconductor is also called "CE-OS-TFT".

The In—Ga—Zn—O based semiconductor may be amorphous or crystalline. As a crystalline In—Ga—Zn—O based semiconductor, the crystalline In—Ga—Zn—O based semiconductor in which the c-axis is aligned so as to be substantially perpendicular to the layer surface is preferable.

Note that a crystal structure of the crystalline In—Ga—Zn—O based semiconductor is described, for example, in the above-described Japanese Laid-Open Patent Publication No. 2014-7399, Japanese Laid-Open Patent Publication No. 2012-134475, Japanese Laid-Open Patent Publication No. 2014-209727, or the like. For reference, all of the disclosure contents of Japanese Laid-Open Patent Publication No. 2012-134475 and Japanese Laid-Open Patent Publication No. 2014-209727 are incorporated herein by reference. The TFT having the In—Ga—Zn—O based semiconductor layer has a high mobility (more than 20 times when compared with a-Si TFT) and a small leakage current (less than 1/100 when compared with a-Si TFT). Thus, the TFT having the In—Ga—Zn—O based semiconductor layer can be suitably used as a drive TFT (for example, TFT included in a drive circuit provided on a same board as a display region, in a periphery of a display region including a plurality of pixel circuits) and a pixel TFT (TFT provided in the pixel circuit).

The oxide semiconductor layer may include other oxide semiconductors in place of the In—Ga—Zn—O based semiconductor. The oxide semiconductor layer may include, for example, an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Furthermore, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, or the like. Here, Al, Ti, Cd, Ge, Pb, Mg, Zr, and Hf represent aluminum, titanium, cadmium, germanium, lead, magnesium, zirconium, and hafnium, respectively.

Note that although the cases in which the present invention is applied to a liquid crystal display device have been described so far, the present invention can be applied to various kinds of display devices having a function of suspending drive of a display panel.

INDUSTRIAL APPLICABILITY

Since the display device of the present invention has a feature that power consumption can be reduced even when a part of a display image changes, it can be applied to various kinds of display devices having a function of suspending drive of a display panel, such as a liquid crystal display device.

DESCRIPTION OF REFERENCE CHARACTERS 10, 20: LIQUID CRYSTAL DISPLAY DEVICE
11, 21, 31: LIQUID CRYSTAL PANEL
12: DISPLAY CONTROL CIRCUIT
13, 25: SCANNING LINE DRIVE CIRCUIT
14, 27: DATA LINE DRIVE CIRCUIT
15: STILL ROW DISCRIMINATION UNIT

16: PIXEL CIRCUIT
17: TFT
28: STILL PORTION DISCRIMINATION UNIT
44: OXIDE SEMICONDUCTOR LAYER

The invention claimed is:

1. A display device comprising:
a display panel including a plurality of pixel circuits arranged in a row direction and a column direction, a plurality of scanning lines, and a plurality of data lines each connected to all pixel circuits of the plurality of pixel circuits in each column;
a scanning line drive circuit that applies a selection voltage to a scanning line selected from the plurality of the scanning lines;
a data line drive circuit that applies data voltages in accordance with a video signal to the plurality of the data lines; and
discrimination circuitry that discriminates whether a portion of the video signal is a still portion, wherein
the display panel further includes: (i) a first side and a second side extending in the column direction, and is divided into an even number of blocks in the row direction, the even number being equal to or larger than four, (ii) at least a first block and a second block adjacent to the first side, and (iii) at least a third block and a fourth block adjacent to the second side,
pixel circuits of the plurality of pixel circuits in one row and in one block are connected to one of the plurality of scanning lines,
among the plurality of scanning lines, a first scanning line connected to pixel circuits in one of the blocks on the first side extends from the first side, and a second scanning line connected to pixel circuits in one of the blocks on the second side extends from the second side,
the scanning line drive circuit includes first drive circuitry that drives the first scanning line from the first side and second drive circuitry that drives the second scanning line from the second side,
the discrimination circuitry discriminates whether the video signal corresponding to the pixel circuits in the one row and in the one block is the still portion, and
the scanning line drive circuit applies a non-selection voltage to a scanning line of the plurality of scanning lines corresponding to a portion discriminated as the still portion.

2. The display device according to claim 1, wherein the data line drive circuit does not apply a data voltage to all of the plurality of data lines corresponding to the portion discriminated as the still portion.

3. The display device according to claim 1, wherein
the first block is closer to the first side than the second block,
the fourth block is closer to the second side than the third block, and
among the scanning lines connected to the pixel circuits in the one row, a scanning line connected to pixel circuits in the first block is located at a position closer to the pixel circuits in the one row than a scanning line connected to pixel circuits in the second block, and a scanning line connected to pixel circuits in the fourth block is located at a position closer to the pixel circuits in the one row than a scanning line connected to pixel circuits in the third block.

4. The display device according to claim 2, wherein the data line drive circuit does not apply any voltage to all of the plurality of data lines corresponding to the portion discriminated as the still portion.

5. The display device according to claim 2, wherein the data line drive circuit applies a same voltage as that applied in an immediately preceding horizontal period, to the data line corresponding to the portion discriminated as the still portion.

6. The display device according to claim 2, wherein a number of times that the discrimination circuitry consecutively discriminates the video signal corresponding to the pixel circuits in one row and in one block as the still portion is limited.

7. The display device according to claim 1, wherein each of the plurality of pixel circuits includes a thin film transistor including an oxide semiconductor layer.

8. The display device according to claim 7, wherein the thin film transistor is a channel etch type thin film transistor.

9. The display device according to claim 7, wherein the oxide semiconductor layer is formed of indium gallium zinc oxide.

10. The display device according to claim 7, wherein the oxide semiconductor layer is formed of a crystalline oxide semiconductor.

11. The display device according to claim 7, wherein the oxide semiconductor layer has a laminated structure.

12. A drive method for a display device that includes a display panel including a plurality of pixel circuits arranged in a row direction and a column direction, a plurality of scanning lines, and a plurality of data lines each connected to tall pixel circuits of the plurality of pixel circuits in each column, the method comprising the steps of:
applying a selection voltage to a scanning line selected from among the plurality of the scanning lines;
applying data voltages in accordance with a video signal to the plurality of the scanning lines; and
discriminating whether a portion of the video signal is a still portion, wherein
the display panel includes: (i) a first side and a second side extending in the column direction and is divided into an even number of blocks in the row direction, the even number being equal to or larger than four, (ii) at least a first block and a second block adjacent to the first side, and (iii) at least a third block and a fourth block adjacent to the second side,
pixel circuits of the plurality of pixel circuits in one row and in one block are connected to one of the plurality of scanning lines,
among the plurality of scanning lines, a first scanning line connected to pixel circuits in one of the blocks on the first side extends from the first side, and a second scanning line connected to pixel circuits in one of the blocks on the second side extends from the second side,
applying the selection voltage includes driving a first scanning line from the first side and driving a second scanning line from the second side,
in the discriminating, whether the video signal corresponding to the pixel circuits in the one row and in the one block is the still portion is discriminated, and
in applying the selection voltage, a non-selection voltage is applied to a scanning line of the plurality of scanning lines corresponding to a portion discriminated as the still portion.

13. The drive method for the display device according to claim 12, wherein in applying the data voltages, a data voltage is not applied to all of the plurality of data lines corresponding to the portion discriminated as the still portion.

14. The drive method for the display device according to claim 12, wherein the first block is closer to the first side than the second block, the fourth block is closer to the second side than the third block, and among the scanning lines connected to the pixel circuits in the one row, a scanning line connected to pixel circuits in the first block is located at a position closer to the pixel circuits in the one row than a scanning line connected to pixel circuits in the second block, and a scanning line connected to pixel circuits in the fourth block is located at a position closer to the pixel circuits in the one row than a scanning line connected to pixel circuits in the third block.

\* \* \* \* \*